(12) United States Patent
Chen et al.

(10) Patent No.: US 8,227,307 B2
(45) Date of Patent: Jul. 24, 2012

(54) METHOD FOR REMOVING THRESHOLD VOLTAGE ADJUSTING LAYER WITH EXTERNAL ACID DIFFUSION PROCESS

(75) Inventors: Kuang-Jung Chen, Hopewell Junction, NY (US); Ricardo A. Donaton, Hopewell Junction, NY (US); Wu-Song Huang, Hopewell Junction, NY (US); Wai-Kin Li, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 257 days.

(21) Appl. No.: 12/490,353

(22) Filed: Jun. 24, 2009

(65) Prior Publication Data

US 2010/0330810 A1 Dec. 30, 2010

(51) Int. Cl.
*H01L 21/8238* (2006.01)
*H01L 21/31* (2006.01)

(52) U.S. Cl. ..... 438/199; 438/703; 438/706; 430/275.1; 257/204; 257/E21.632

(58) Field of Classification Search ............... 438/703, 438/199; 430/275.1
See application file for complete search history.

(56) References Cited

U.S. PATENT DOCUMENTS

| | | | |
|---|---|---|---|
| 6,203,965 B1 * | 3/2001 | Cameron et al. | 430/270.1 |
| 7,023,055 B2 | 4/2006 | Ieong et al. | |
| 7,329,923 B2 | 2/2008 | Doris et al. | |
| 7,790,624 B2 * | 9/2010 | Sharma | 438/745 |
| 2005/0116290 A1 | 6/2005 | de Souza et al. | |
| 2008/0299486 A1 * | 12/2008 | Mahoney et al. | 430/270.1 |
| 2009/0085175 A1 * | 4/2009 | Clark et al. | 257/637 |
| 2009/0274980 A1 * | 11/2009 | Kang et al. | 430/311 |

* cited by examiner

*Primary Examiner* — N Drew Richards
*Assistant Examiner* — John P Dulka
(74) *Attorney, Agent, or Firm* — Scully, Scott, Murphy & Presser, P.C.; Yuanmin Cai

(57) ABSTRACT

The present invention provides a method of forming a threshold voltage adjusted gate stack in which an external acid diffusion process is employed for selectively removing a portion of a threshold voltage adjusting layer from one device region of a semiconductor substrate. The external acid diffusion process utilizes an acid polymer which when baked exhibits an increase in acid concentration which can diffuse into an underlying exposed portion of a threshold voltage adjusting layer. The diffused acid reacts with the exposed portion of the threshold voltage adjusting layer providing an acid reacted layer that can be selectively removed as compared to a laterally adjacent portion of the threshold voltage adjusting layer that is not exposed to the diffused acid.

20 Claims, 3 Drawing Sheets

METHOD FOR REMOVING THRESHOLD VOLTAGE ADJUSTING LAYER WITH EXTERNAL ACID DIFFUSION PROCESS

FIELD OF THE INVENTION

The present invention relates to semiconductor device fabrication, and more particularly to a method of forming a semiconductor device including a threshold voltage adjusted gate stack in which an external acid diffusion process is employed in patterning the threshold voltage adjusted gate stack.

BACKGROUND OF THE INVENTION

In semiconductor devices including field effect transistors (FETs), threshold voltage of the transistors has been conventionally controlled by doping an impurity into the channel region and by appropriately adjusting the dose amount. Threshold voltage control using only this technique, e.g., only through adjustment of the amount of the channel impurity, however, raises nonconformities such that an increase in the dose of the impurity to be doped into the channel region may lower ON-state current due to scattering by the impurity, may increase the Gate-Induced Drain Leakage (GIDL) current, and may increase substrate current upon application of substrate voltage. For this reason, low-power-consumption devices having a large amount of impurity doped into the channel region have occasionally resulted in a decrease in an ON-state current, and an increase in the GIDL current.

Another prior art technique that has been conventionally used to control the threshold voltage of FET devices is to fabricate a device in which different conductivity type transistors, e.g., nFETs and pFETs, are formed on gate oxides that have a different thickness. That is, it is known to form a device in which the thickness of a gate oxide film of an nFET is different from that of a gate oxide film of a pFET.

In recent years, there has been another trend of using a high dielectric constant film, i.e., a high k dielectric, as the gate insulating film of FET devices. High k dielectrics are those dielectrics that have a dielectric constant that is greater than silicon oxide. Representative high k dielectrics that are useful as a gate insulating material include metal oxides such as, for example, zirconium oxide and hafnium oxide. The use of high k dielectrics as the gate insulating film of a metal oxide semiconductor field effect transistor (MOSFET) can successfully reduce the equivalent silicon oxide thickness in an electrical sense, even if the physical thickness thereof is increased relative to a silicon oxide gate dielectric. Hence, high k dielectric films when used as a gate insulating film are stable both in a physical sense and in a structural sense. This makes it possible to increase the MOS capacity for improved MOSFET characteristics, and to reduce gate leakage current as compared with the conventional devices in which silicon oxide was used as the gate insulating film.

Although high k dielectrics provide improvements over conventionally used silicon oxide as the gate insulating film in a FET device, the use of the same is not without problems. For example, FET devices including high k gate dielectrics exhibit a non-ideal threshold voltage when the device is used. Although this problem, e.g., threshold voltage shift from an ideal value, is exhibited for both pMOSFET and nMOSFET devices, it is more pronounced with nMOSFET devices.

In the prior art, various techniques including, for example, forming a threshold voltage adjusting layer interposed between the high k gate dielectric and the gate electrode have been proposed. Although such threshold voltage adjusting techniques have been proposed, threshold voltage centering still remains a challenge in such devices due to the difficulty of integrating band-edge metals for nFETs and pFETs.

Also, in prior art techniques in which a threshold voltage adjusted gate stack is provided that includes a threshold voltage adjusting layer interposed between a high k gate dielectric and a gate electrode, wet etching is typically used in patterning the threshold voltage adjusted gate stacks. When wet etching is employed in patterning the threshold voltage adjusted gate stacks, an undercut of the threshold voltage adjusting layer beneath the gate electrode is observed. The undercutting of the threshold voltage adjusting layer is undesirable since the dimension of the final gate stack would deviate from required criteria.

As such, there exists a need for providing a semiconductor device including a threshold voltage adjusted gate stack in which undercutting of the threshold voltage adjusting layer is eliminated.

SUMMARY OF THE INVENTION

The present invention provides a method of forming a threshold voltage adjusted gate stack in which an external acid diffusion process is employed for selectively removing a portion of a threshold voltage adjusting layer from one device region of a semiconductor substrate. The external acid diffusion process utilizes an acid polymer which when baked exhibits an increase in acid concentration which can diffuse into an underlying exposed portion of the threshold voltage adjusting layer. The diffused acid reacts with the exposed portion of the threshold voltage adjusting layer providing an acid reacted layer that can be selectively removed as compared to a laterally adjacent portion of the threshold voltage adjusting layer that is not exposed to the diffused acid.

In general terms, the method of the present invention includes forming a threshold voltage adjusting layer atop a high k gate dielectric that is located above a semiconductor substrate. Next, a patterned mask is formed protecting a portion of the threshold voltage adjusting layer, while leaving another portion of the threshold voltage adjusting layer unprotected. After forming the patterned mask, an acid polymer is formed atop the patterned mask and atop the exposed portion of the threshold voltage adjusting layer and thereafter the acid polymer is subjected to a baking step that increases the acid concentration in the acid polymer and diffuses acid moieties into the exposed portion of the threshold voltage adjusting layer which react with the exposed threshold voltage adjusting layer to provide an acid reacted threshold voltage adjusting layer. After baking the acid polymer, the baked acid polymer, the patterned mask and the acid reacted threshold voltage adjusting layer are removed.

In some embodiments of the invention in which the semiconductor substrate includes a first device region for forming either an nFET or a pFET and a second device region for forming the other of an nFET or a pFET not being fabricated within the first device region, the method includes forming a first threshold voltage adjusting layer atop a high k gate dielectric that is located above a semiconductor substrate having a first device region and a second device region. Next, a first patterned mask is formed protecting a portion of the threshold voltage adjusting layer within the first device region, while leaving another portion of the first threshold voltage adjusting layer within the second device region unprotected and thereafter a first acid polymer is formed atop the first patterned mask and atop the exposed portion of the threshold voltage adjusting layer. The first acid polymer is then baked to increase the acid concentration in the first acid polymer and to diffuse acid moieties into the exposed portion of the first threshold voltage adjusting layer which react with the first exposed threshold voltage adjusting layer to provide an acid reacted first threshold voltage adjusting layer within the second device region that laterally abuts a non-acid reacted first threshold voltage adjusting layer within the first device region. After baking the first acid polymer, the baked first acid polymer, the first patterned mask and the first acid reacted threshold voltage adjusting layer are removed. Next, a second threshold voltage adjusting layer of an opposite threshold voltage adjusting type as compared to the first threshold voltage adjusting layer is formed atop the high k gate dielectric and the non-acid reacted first threshold voltage adjusting layer. The steps of forming a patterned mask, acid polymer application and baking are repeated to provide a second acid reacted threshold voltage adjusting layer in the first device region abutting a second non-acid reacted threshold voltage layer in the second device region. Next, the second baked acid polymer, the second patterned mask and the second acid reacted threshold voltage adjusting layer are removed from the first device region.

DETAILED DESCRIPTION OF THE INVENTION

The present invention, which provides a method for patterning a threshold voltage adjusted gate stack utilizing an external acid diffusion process to remove unwanted threshold voltage adjusting material from preselected device regions, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As mentioned above, a method of forming a threshold voltage adjusted gate stack is provided in which an external acid diffusion process is employed for selectively removing a portion of a threshold voltage adjusting layer from one device region of a semiconductor substrate. The external acid diffusion process utilizes an acid polymer which when baked exhibits an increase in acid concentration which can diffuse into an underlying exposed portion of the threshold voltage adjusting layer. The diffused acid reacts with the exposed portion of the threshold voltage adjusting layer providing an acid reacted layer that can be selectively removed as compared to a laterally adjacent portion of the threshold voltage adjusting layer that is not exposed to the diffused acid. The method of the present invention advantageously controls the diffusion of acid in the underlying threshold voltage adjusting layer and provides an acid reacted threshold voltage layer that can be etched more selectively as compared to a non-acid treated threshold voltage adjusting layer. As such, and during a subsequent etching process, no undercutting of the threshold voltage adjusting layer is observed.

Figure 1:
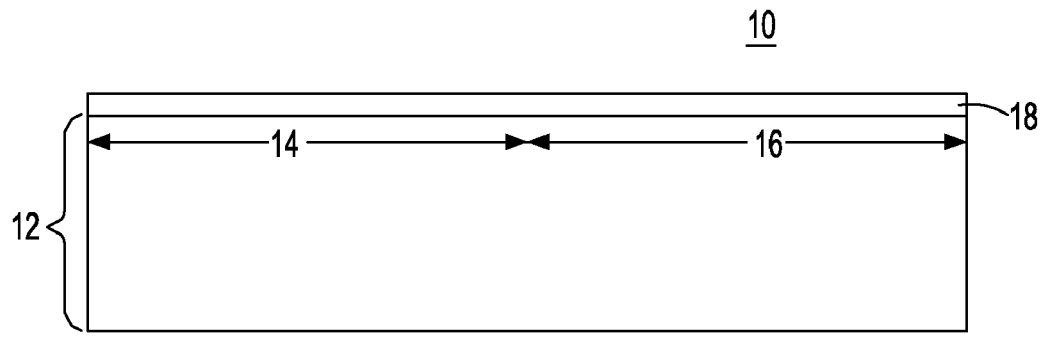
FIG. 1 is a pictorial representation (through a cross sectional view) illustrating an initial structure including a semiconductor substrate having a high k gate dielectric disposed thereon that can be employed in the present invention.

Reference is first made to FIG. 1 which shows an initial structure 10 that can be employed in the present invention. Specifically, the initial structure 10 includes a semiconductor substrate 12 including a first device region 14 and a second device region 16. Although two devices regions are described and illustrated, the present invention can be employed in embodiments wherein a single device region is present, or in embodiments in which a plurality of device regions are present.

The initial structure 10 illustrated in FIG. 1 also includes a high k gate dielectric 18 located atop the semiconductor substrate 12 in both the first device region 14 and the second device region 16. The first device region 14 is either an nFET device region or a pFET device region, while the second device region 16 is the other of an nFET device region or a pFET device region.

The semiconductor substrate 12 illustrated in FIG. 1 is comprised of any semiconductor material including, but not limited to Si, Ge, SiGe, SiC, SiGeC, GaAs, GaN, InAs, InP and all other III/V or II/VI compound semiconductors. Semiconductor substrate 12 may also comprise an organic semiconductor or a layered semiconductor such as Si/SiGe, a silicon-on-insulator (SOI), a SiGe-on-insulator (SGOI) or a germanium-on-insulator (GOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques that are well known in the art. See, for example, co-owned U.S. Pat. No. 7,329,923, U.S. Publication No. 2005/0116290, dated Jun. 2, 2005 and U.S. Pat. No. 7,023,055, the entire contents of each are incorporated herein by reference.

The semiconductor substrate 12 may also include a first doped (n- or p-) region, and a second doped (n- or p-) region. For clarity, the doped regions are not specifically shown in any of the drawings of the present application. The first doped region and the second doped region may be the same, or they may have different conductivities and/or doping concentrations. These doped regions are known as "wells" and they are formed utilizing conventional ion implantation processes.

At least one isolation region (not shown) is then typically formed into the semiconductor substrate 12. The at least one isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities, i.e., nFETs and pFETs.

After processing the semiconductor substrate 12, a chemox layer (not shown) is optionally formed on the surface of the semiconductor substrate 12. The optional chemox layer is formed utilizing a conventional growing technique that is well known to those skilled in the art including, for example, oxidation or oxynitridation. In some embodiments of the invention, the chemox layer is formed by a wet chemical oxidation process. When the substrate 12 is a Si-containing semiconductor, the chemox layer is comprised of silicon oxide, silicon oxynitride or a nitrided silicon oxide. When the semiconductor substrate 12 is other than a Si-containing semiconductor, the chemox layer may comprise a semiconducting oxide, a semiconducting oxynitride or a nitrided semiconducting oxide. The thickness of the chemox layer is typically from 0.5 to 1.5 nm, with a thickness from 0.8 to 1 nm being more typical. The thickness, however, may be different after processing at higher temperatures, which are usually required during FET or CMOS fabrication.

High k gate dielectric 18 is then formed atop the semiconductor substrate 12. In some embodiments, and as illustrated, the high k gate dielectric 18 is formed directly on a surface of the semiconductor substrate 12. In other embodiments of the invention, the high gate dielectric 18 is formed on a surface of the chemox layer described above.

The high k gate dielectric 18 employed in the present invention includes any dielectric metal oxide having a dielectric constant that is greater than the dielectric constant of silicon oxide, e.g., 3.9. Typically, the high k gate dielectric 18 that is employed in the present invention has a dielectric constant greater than 4.0, with a dielectric constant of greater than 8.0 being even more typical. Exemplary high k dielectric materials include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the high k gate dielectric 18. Each value of x is independently from 0.5 to 3 and each value of y is independently from 0 to 2.

The thickness of the high k gate dielectric 18 may vary depending on the technique used to form the same. Typically, however, the high k gate dielectric 18 has a thickness from 0.5 nm to 10 nm, with a thickness from 1.0 nm to 5 nm being even more typical. The high k gate dielectric 18 employed in the invention may have an effective oxide thickness on the order of, or less than, 1 nm.

The high k gate dielectric 18 is formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes.

Figure 2:
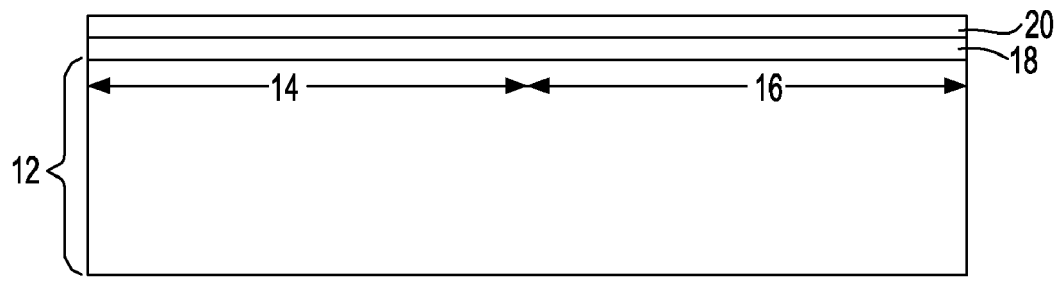
FIG. 2 is a pictorial representation (through a cross sectional view) illustrating the initial structure of FIG. 1 after forming a first threshold voltage adjusting layer atop the high k gate dielectric layer.

Reference is now made to FIG. 2, which illustrates the initial structure of FIG. 1 after forming a first threshold voltage adjusting layer 20 atop the high k gate dielectric 18. The term "threshold voltage adjusting layer" as used throughout the instant application denotes a material that moves the threshold voltage of a gate stack towards either an nFET or pFET band edge. The threshold first voltage adjusting layer 20 employed in the present invention may include an nFET threshold voltage adjusting material or a pFET threshold voltage adjusting material. The type of threshold voltage adjusting material employed in this step of the invention is dependent on which conductivity type device, e.g., nFET or pFET, is being fabricated.

One example of an nFET threshold voltage adjusting material that can be used in the present invention is a rare earth metal-containing material that comprises an oxide or nitride of at least one element from Group IIIB of the Periodic Table of Elements (CAS version) including, for example, La, Ce, Pr, Nd, Pm, Sm, Eu, Ga, Tb, Dy, Ho, Er, Tm, Yb, Lu or mixtures thereof. Preferably, the rare earth metal-containing material comprises an oxide of La, Ce, Y, Sm, Er and/or Tb, with $La_2O_3$ being more preferred.

The rare earth metal-containing material is formed utilizing a conventional deposition process including, for example, evaporation, molecular beam deposition, metalorgano chemical vapor deposition (MOCVD), atomic layer deposition (ALD), physical vapor deposition (PVD) and other like deposition processes. In one embodiment of the present invention, the rare earth metal-containing material is formed by placing the structure including the high k gate dielectric into the load-lock of a molecular beam deposition chamber, followed by pumping this chamber down to the range of $10^{-5}$ Torr to $10^{-8}$ Torr. After these steps, the structure is inserted, without breaking vacuum into the growth chamber where the rare earth metal-containing material such as La oxide is deposited by directing atomic/molecular beams of the rare earth metal and oxygen or nitrogen onto the structure's surface. Specifically, because of the low pressure of the chamber, the released atomic/molecular species are beamlike and are not scattered prior to arriving at the structure. A substrate temperature of about 300° C. is used. In the case of $La_2O_3$ deposition, the La evaporation cell is held in the temperature range of 1400° C. to 1700° C., and a flow rate of 1 sccm to 3 sccm of molecular oxygen is used. Alternatively, atomic or excited oxygen may be used as well, and this can be created by passing the oxygen through a radio frequency source excited in the range of 50 Watts to 600 Watts. During the deposition, the pressure within the chamber can be in the range from $1 \times 10^{-5}$ Torr to $8 \times 10^{-5}$ Torr, and the La oxide growth rate can be in the range from 0.1 nm per minute to 2 nm per minute, with a range from 0.5 nm per minute to 1.5 nm per minute being more typical.

Another example of an nFET threshold voltage adjusting material that can be used in the present invention is an alkaline earth metal-containing material that comprises a compound having the formula $MA_x$ wherein M is an alkaline earth metal (Be, Mg, Ca, Sr, and/or Ba), A is one of O, S and a halide, and x is 1 or 2. It is noted that the present invention contemplates alkaline earth metal-containing compounds that include a mixture of alkaline earth metals and/or a mixture of anions, such as an oxychloride. Examples of alkaline earth metal-containing compounds that can be used in the present invention include, but are not limited to MgO, MgS, $MgF_2$, $MgCl_2$, $MgBr_2$, $MgI_2$, CaO, CaS, $CaF_2$, $CaCl_2$, $CaBr_2$, $CaI_2$, SrO, SrS, $SrF_2$, $SrCl_2$, $SrBr_2$, $SrI_2$, BaO, BaS, $BaF_2$, $BaCl_2$, $BaBr_2$, and $BaI_2$. In one preferred embodiment of the present invention, the alkaline earth metal-containing compound includes Mg. MgO is a highly preferred alkaline earth metal-containing material employed in the present invention.

The alkaline earth metal-containing material is formed utilizing a conventional deposition process including, for example, sputtering from a target, reactive sputtering of an alkaline earth metal under oxygen plasma conditions, electroplating, evaporation, molecular beam deposition, MOCVD, ALD, PVD and other like deposition processes.

In addition to nFET threshold voltage adjusting materials, the first threshold voltage adjusting layer 20 can alternatively be a pFET threshold voltage adjusting material. Examples of pFET threshold voltage adjusting materials include Al (and its compounds that are non-conductive such as, for example $Al_2O_3$), Ge (and its compounds that are non-conductive such as, for example $GeO_2$), and non-conductive compounds of Ti and Ta such as, $TiO_2$ and $Ta_2O_5$ respectively.

The nFET threshold voltage adjusting materials are formed utilizing conventional deposition processes well known to those skilled in the art including, but not limited to chemical vapor deposition (CVD), plasma enhanced chemical vapor deposition (PECVD), chemical solution deposition, atomic layer deposition (ALD), physical vapor deposition (PVD), sputtering and plating.

Notwithstanding the type of material used as the first threshold voltage adjusting layer 20, the first threshold voltage adjusting layer 20 has a thickness from 0.1 nm to 5.0 nm, with a thickness from 1.0 nm to 3.0 nm being even more typical.

Figure 3:
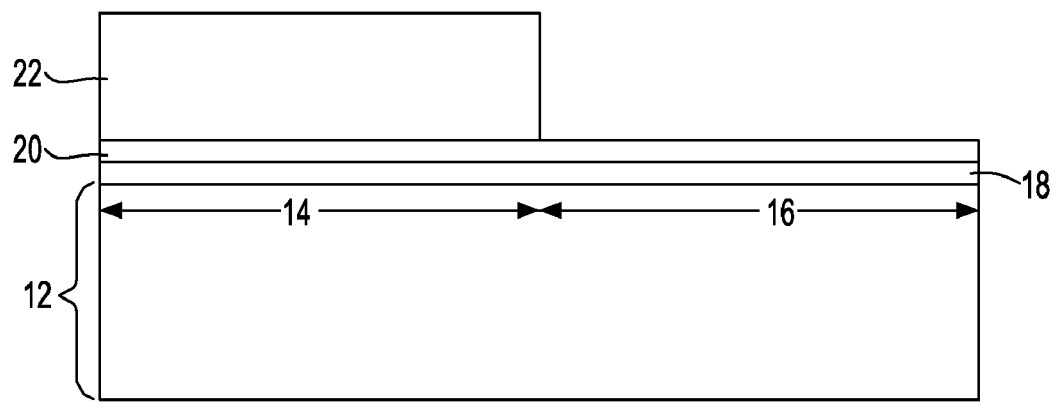
FIG. 3 is a pictorial representation (through a cross sectional view) illustrating the structure of FIG. 2 after forming a first patterned mask atop the first threshold voltage adjusting layer in one of the device regions, while leaving another device region unprotected.

Next, and as is illustrated in FIG. 3, a first patterned mask 22 is formed on the surface of the first threshold voltage adjusting layer 20 protecting one of the device regions, while leaving the other device region unprotected. In the embodiment illustrated, the first patterned mask 22 is protecting a portion of the first threshold voltage adjusting layer 20 that is located in the first device region 14, while another portion of the threshold voltage adjusting layer 20 in the second device region 16 is left unprotected.

The first patterned mask 22 employed in the present invention may include a hard mask, a photoresist or a multi-layered stack thereof. In one embodiment, the first patterned mask 22 is a photoresist. In another embodiment, the first patterned mask 22 is a hard mask selected from a semiconductor oxide, semiconductor nitride, or semiconductor oxynitride.

The first patterned mask 22 is formed utilizing conventional techniques including deposition, photolithography and optionally etching, that are well known to those skilled in the art. In particular, and when the patterned mask is comprised solely of a photoresist, a blanket layer of photoresist material is first applied to the upper surface of the first threshold voltage adjusting layer 20 utilizing a conventional deposition process such as, for example, spin-on coating, evaporation, chemical vapor deposition (CVD), and plasma enhanced chemical vapor deposition (PECVD). After deposition of the blanket layer of photoresist, the blanket layer is patterned by lithography including exposing the photoresist to a desired pattern of radiation and then developing the exposed resist utilizing a conventional resist developer.

When a hard mask is used as the first patterned mask 22, a blanket layer of hard mask material is first deposited on the surface of the first threshold voltage adjusting layer 20 utilizing a conventional deposition process including, for example, CVD, PECVD, chemical solution deposition, evaporation, atomic layer deposition (ALD), and physical vapor deposition (PVD). Next, a blanket layer of photoresist is applied atop the blanket layer of hard mask material, and thereafter lithography is used to pattern the photoresist. The pattern within the patterned resist is then transferred to the underlying hard mask material utilizing one of dry etching (reactive ion etching, ion beam etching, plasma etching, or laser ablation) and chemical wet etching. The patterned resist is optionally removed from the structure following the pattern transfer step utilizing a conventional resist stripping process well known to those skilled in the art. Alternatively, the patterned resist can remain atop the pattern hard mask and form a multilayered patterned mask of the invention.

Figure 4:
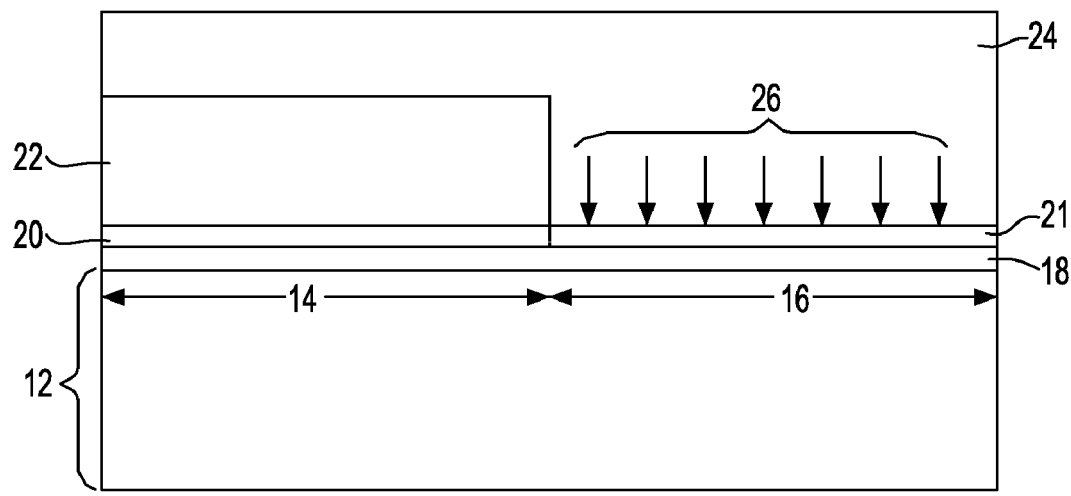
FIG. 4 is a pictorial representation (through a cross sectional view) illustrating the structure of FIG. 3 after forming an acid polymer atop the structure in both the device regions and during a baking step in which the acid concentration increases, acid diffuses into the exposed first threshold voltage adjusting layer and the diffused acid reacts with the underlying first threshold voltage adjusting layer.

Next, and as illustrated in FIG. 4, an acid polymer 24 is formed in both the device regions covering the first patterned mask 22 in the first device region 14, and the exposed portion of the first threshold voltage adjusting layer 20 in the second device region 16. It is noted that in the device region not including the first patterned mask 22, the acid polymer 24 is in direct contact with the underlying first threshold voltage adjusting layer 20. The term "acid polymer" as used throughout the present application denotes a chemical compound or mixture of compounds formed by polymerization which include repeating structural units including at least one acidic functional group. The polymeric backbone of the acid polymer employed in the present invention may include polyolefins, polyolefin sulfones, polyketones and polyethers. The acid polymer can be formed utilizing conventional polymerization processes known to those skilled in the art or the acid polymer can be purchased from a suitable supplier.

In one embodiment of the present invention, the acid polymers used include strong acids. Acids that are completely or nearly 100% ionized when dissolved in water are referred to herein as strong acids. Hydrogen halides such as, for example, HCl, HBr and HI, are typical strong acids. Other strong acids are oxyacids of halogens such as, for example, $HClO_3$, $HBrO_3$, $HIO_3$, $HClO_4$, $HBrO_4$, $HIO_4$, sulfuric acid, sulfonic acid and nitric acid. The acid polymers more preferably include super acids. A super acid is an acid with an acidity greater than that of 100% sulfuric acid, which has a Hammet acidity function ($H_o$) of $-12$. Commercially available super acids include, but are not limited to, trifluoromethanesulfonic acids ($CF_3SO_3H$), also known as triflic acid, and fluorosulfuric acid ($FSO_3H$), both of which are about a thousand times stronger (i.e., they have a more negative $H_o$ value) than sulfuric acid. Some super acids are synthesized such as bis[N-(trifluoromethylsulfonyl)trifluoromethanesulfonimidoyl]imide and N,N'-bis(trifluoromethylsulfonyl)diimino trifluoromethanesulfonic acid. Some of the super acids contain multiple fluorine moieties such as, for example, $HBF_4$, $HPF_6$, and $HAsF_6$.

In one embodiment of the present invention the acid polymer includes a structure that includes the aforementioned strong acid functionality, which can be released after deposition and a baking process.

One example of a polymer containing a strong acid functionality is a polymer containing a sulfur-containing acidic moiety. Some common sulfur-containing acidic moieties are sulfonic acid moieties as shown in the structures below:

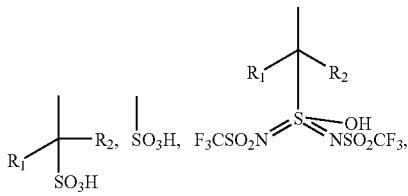

wherein each $R_1$ and $R_2$ is hydrogen, a halogen, an alkyl, an aryl or a combination thereof. In one embodiment of the invention, at least one of $R_1$ and $R_2$ is a halogen. In this embodiment of the invention, the halogen is preferably fluorine. A highly preferred acid moiety is fluorosulfonic acid.

Other examples of polymers containing strong acids moieties are salts of strong acids. The salts contain the complex of a weak base and a strong acid. During application and baking of such an acid polymer, the strong acids from such polymers will be released from the salts. These polymers containing salts of strong acids represent another embodiment of the invention. Some examples of this 'class' of acid polymers are salts of ammonium salts of strong acids such as shown below:

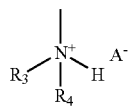

wherein each $R_3$ and $R_4$ is hydrogen, an alkyl, an aryl, a combination thereof or alternatively $R_3$ and $R_4$ can be taken together, i.e., linked, to form a cyclic structure. In the above structure, $A^-$ is an anion of a strong acid as described above.

The term "alkyl" as used in the present invention denotes an aliphatic radical of the formula $C_nH_{2n+1}$ wherein n is from 1 to 20 carbon atoms. Illustrative examples of alkyls that can be employed in the present invention include methyl, ethyl, butyl, pentyl, hexyl, heptyl, otcyl, etc. The term "aryl" denotes a radical that is derived from an aromatic compound by the removal of one hydrogen atom. The aromatic compound may contain from 6 to 18, preferably 6 to 12 carbon atoms. An example of an aryl that can be used in the present invention includes phenyl. The term "halogen" denotes an element such as F, Cl, Br, and I from Group VII A of the Periodic Table of Elements (CAS version).

Notwithstanding the type of acid polymer employed, the acid polymer 24 shown in FIG. 4 is applied to the structure shown in FIG. 3 utilizing a conventional deposition process including, but not limited to spin-on coating, evaporation, chemical solution deposition, chemical vapor deposition (CVD), and plasma enhanced chemical vapor deposition (PECVD). In one embodiment of the invention, the acid polymer 24 is formed by spin-on coating.

It is noted that the acid polymer prior to a subsequent baking step, has a pH value that is in a range from 0 to 7, preferably from 1 to 5. After baking the acid polymer has a pH value that is greater than about 2.

After application of the acid polymer 22 to the structure, a baking step is performed which serves to increase the pH of the acid polymer, as indicated above, and to drive acid moieties into the underlying first threshold voltage adjusting layer. The arrows which are labeled as 26 in FIG. 4 indicate the diffusion of acid moieties towards the acid polymer/first threshold voltage adjusting layer interface. Also, during this baking step the diffused acid reacts with the exposed portion of the first threshold voltage adjusting layer providing an acid reacted first threshold voltage adjusting layer 21 that is laterally abutting a non-acid reacted first threshold voltage adjusting layer, i.e., layer 20. Typically, the reaction that occurs during baking converts the acid exposed portion of the threshold voltage adjusting layer into a metal salt. For example, and when the threshold voltage adjusting layer 20 is comprised of $La_2O_3$, a salt of $La_2O_3$ such as $LaCl_3$, is formed.

The baking step of the present invention is typically performed at a temperature from 75° C. to 200° C., with a temperature from 90° C. to 150° C. being even more typical. The baking step is typically performed in an inert ambient including, for example, He, Ar, Ne, Xe, $N_2$ and mixtures thereof. The duration of the baking step is typically from 10 seconds to 300 seconds, with a duration from 60 seconds to 120 seconds being even more typical. It is noted that the baking step of the present invention provides a control diffusion process in which the acid concentration within the applied acid polymer is built up and then transferred into the underlying threshold voltage adjusting layer.

Figure 5:
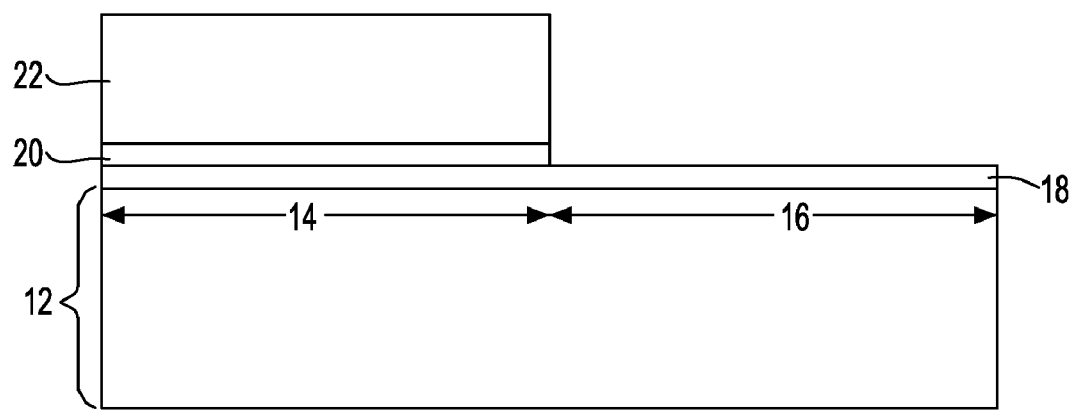
FIG. 5 is a pictorial representation (through a cross sectional view) illustrating the structure of FIG. 4 after removing the acid polymer and the acid exposed first threshold voltage adjusting layer from the structure.

Next, the previously baked acid polymer 24 is removed from the structure providing the structure shown in FIG. 5. The removal of the previously baked acid polymer 24 is performed utilizing an aqueous solution or other safe and environmental friendly organic solvent.

After removing the previously baked acid polymer 24, the structure is subjected to an etching step that selectively removes the acid reacted first threshold voltage adjusting layer 21. The resultant structure is also shown in FIG. 5. Typically, the acid reacted first threshold voltage adjusting layer 21 is removed utilizing a dry etching step such as, for example, reactive ion etching, ion beam etching, plasma etching and laser ablation. In one embodiment of the invention, a plasma etching process is used to strip the acid reacted first threshold voltage adjusting layer 21 from the structure. When the first patterned mask 22 includes a resist, this etching step can also simultaneously remove the patterned resist. When the patterned mask is a hard mask, a separate etching step is performed that removes the hard mask from the structure. The resultant structure that is formed after these steps of the present invention have been performed is shown, for example, in FIG. 6.

Figure 6:
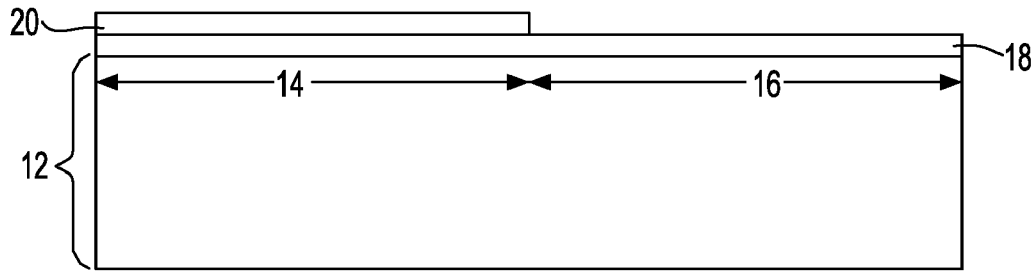
FIG. 6 is a pictorial representation (through a cross sectional view) illustrating the structure of FIG. 5 after removing the first patterned mask.

Next, a second threshold voltage adjusting layer is applied to the structure shown in FIG. 6. The second threshold voltage adjusting layer is the other of the nFET or pFET threshold voltage adjusting material not employed as the first threshold voltage adjusting layer 20. The second threshold voltage adjusting layer is applied utilizing one of the techniques described above in respect to the first threshold voltage adjusting layer. Next, a second patterned mask (not shown) is formed over the device region not including the remaining first threshold voltage adjusting layer 20. In the illustrated example, the second patterned resist is formed atop the second device region 16.

Figure 7:
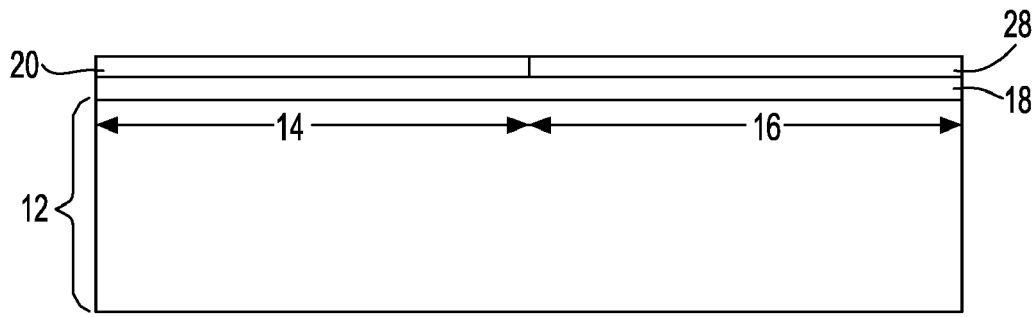
FIG. 7 is a pictorial representation (through a cross sectional view) illustrating the structure of FIG. 6 after forming a second threshold voltage adjusting layer atop the structure, forming a second patterned mask atop the second threshold voltage adjusting layer in the other device region that was not protected by the first patterned mask, forming another acid polymer, diffusing acid into the exposed portion of the second threshold voltage adjusting layer, and removing the another acid polymer, the acid exposed portion of the second threshold voltage adjusting material, and the second patterned mask.

The second patterned mask can include one of the mask materials mentioned above for the first patterned mask and the second patterned mask can be formed utilizing the processing described above in forming the first patterned mask. Next, another acid polymer is applied and baked as described above to provide an acid reacted second threshold voltage adjusting layer in the first device region atop the remaining first threshold voltage adjusting layer. The another acid polymer includes one of the acid polymers mentioned above in respect to acid polymer 24. After baking, the another acid polymer is removed as described above, and thereafter the acid reacted second threshold voltage adjusting layer that is atop the remaining first threshold voltage adjusting layer is removed providing the structure as shown in FIG. 7. In FIG. 7, the remaining second threshold voltage adjusting layer is denoted by reference numeral 28. As shown, the remaining first threshold voltage adjusting layer 20 laterally abuts the remaining second threshold voltage adjusting layer 28.

It is noted that in embodiments in which a single device region is present, the application of the second threshold voltage adjusting layer, second patterned mask and the another acid polymer can be omitted.

At this point of the present invention, a conductive material is formed atop the remaining first threshold voltage adjusting layer 20 and the remaining second threshold voltage adjusting layer 28. The conductive material that is employed in the present invention includes any conductive material including but not limited to polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayers thereof. Preferably, the conductive material that is formed atop the remaining threshold voltage adjusting layers includes at least an elemental metal. In one embodiment of the present invention, a single conductive material layer is formed. In another embodiment of the present invention, a first conductive material layer and a second conductive material layer are formed.

The conductive material is formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other liked deposition processes. When Si-containing materials are used as the conductive material, the Si-containing materials can be doped within an appropriate impurity by utilizing either an in-situ doping deposition process or by utilizing deposition, followed by a step such as ion implantation in which the appropriate impurity is introduced into the Si-containing material. When a metal silicide is formed, a conventional silicidation process is employed.

The as deposited conductive material typically has a thickness from 10 nm to 1000 nm, with a thickness from 50 nm to 500 nm being even more typical.

Figure 8:
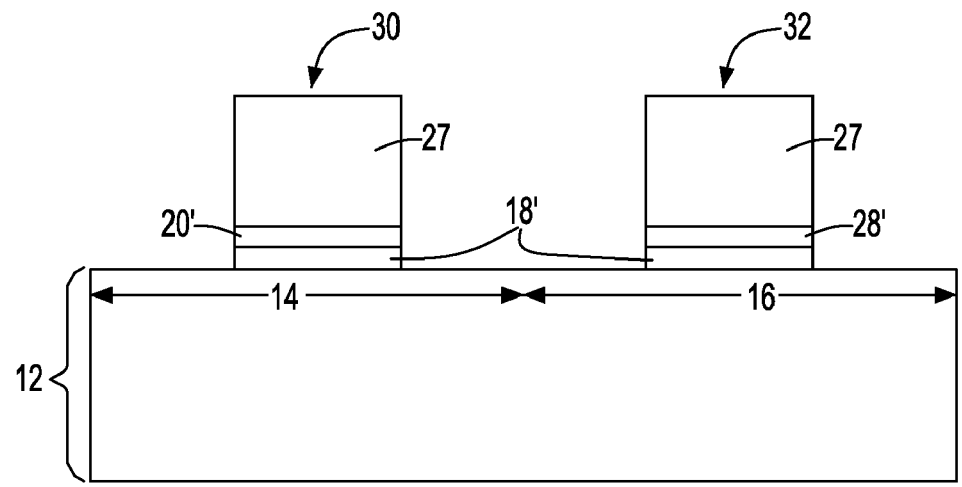
FIG. 8 is a pictorial representation (through a cross sectional view) illustrating the structure of FIG. 7 after forming patterned gate stacks.

After forming the conductive material atop the remaining first and second threshold voltage adjusting layers, the material stack including the same is the patterned by conventional lithography and etching to form a first patterned gate stack 30 in the first device region 14 and a second patterned gate stack 32 in the second device region 16. The first patterned gate stack 30 includes, from bottom to top, patterned high k gate dielectric 18', patterned first threshold voltage adjusting layer 20', and patterned conductive material 27. The second patterned gate stack 32 includes, from bottom to top, patterned high k gate dielectric 18', patterned second threshold voltage adjusting layer 28', and patterned conductive material 27. Note that the patterned conductive material in both device regions is one of the conductive materials described above. The structure including the patterned gate stacks is shown in FIG. 8.

Further CMOS processing steps can now be employed in fabricating at least one FET device. The further CMOS processing steps include, but are not limited to, optional gate sidewall passivation, optional spacer formation, source and drain extension formation and source and drain region formation.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:
   forming a threshold voltage adjusting layer atop a high k gate dielectric that is located above a semiconductor substrate;
   forming a patterned mask protecting a portion of the threshold voltage adjusting layer, while leaving another portion of the threshold voltage adjusting layer unprotected;
   forming an acid polymer atop the patterned mask and atop an exposed portion of the threshold voltage adjusting layer, said acid polymer comprises a polymerized compound or mixture of compounds comprising repeating structural units including at least one acid functional group attached thereto;
   baking the acid polymer to increase the acid concentration in the acid polymer and to diffuse acid moieties into the exposed portion of the threshold voltage adjusting layer which react with the exposed threshold voltage adjusting layer to provide an acid reacted threshold voltage adjusting layer;
   removing the baked acid polymer using an aqueous solution or an organic solvent;
   removing the patterned mask and the acid reacted threshold voltage adjusting layer, wherein at least said acid reacted threshold voltage layer is removed by a dry etching process selected from the group consisting of reactive ion etching, ion beam etching, plasma etching and laser ablation; and
   forming a conductive material atop remaining portions of the threshold voltage adjusting layer.

2. The method of claim 1 wherein said threshold voltage adjusting layer is a pFET threshold voltage adjusting material or an nFET threshold voltage adjusting material.

3. The method of claim 2 wherein said threshold voltage adjusting layer is an nFET threshold voltage adjusting material selected from an oxide or nitride of at least one element from Group IIIB of the Periodic Table of Elements or an alkaline earth metal-containing material having a formula $MA_X$ wherein M is an alkaline earth metal and A is one of O, S and a halide and x is 1 or 2.

4. The method of claim 3 wherein said nFET threshold voltage adjusting material is an oxide from Group IIIB of the Periodic Table of Elements.

5. The method of claim 2 wherein said threshold voltage adjusting layer is a pFET threshold voltage adjusting material selected from an oxide of aluminum, germanium, titanium or tantalum.

6. The method of claim 1 wherein said forming the acid polymer includes selecting a polymer comprising a sulfur-containing acidic moiety.

7. The method of claim 6 wherein said sulfur-containing acidic moiety is a sulfonic acid moiety.

8. The method of claim 7 wherein said sulfonic acid moiety is a fluorosulfonic acid.

9. The method of claim 1 wherein said forming the acid polymer includes selecting a salt of a strong acid.

10. The method of claim 9 wherein said salt of the strong acid is an ammonium salt.

11. The method of claim 1 wherein said acid polymer after baking has a pH value that is greater than about 2.

12. A method of forming a semiconductor structure comprising:
    forming a first threshold voltage adjusting layer atop a high k gate dielectric that is located above a semiconductor substrate having a first device region and a second device region;
    forming a first patterned mask protecting a portion of the threshold voltage adjusting layer within the first device region, while leaving another portion of the first threshold voltage adjusting layer within the second device region unprotected;
    forming a first acid polymer atop the first patterned mask and atop an exposed portion of the threshold voltage adjusting layer, said first acid polymer comprises a polymerized compound or mixture of compounds comprising repeating structural units including at least one acid functional group attached thereto;
    baking the first acid polymer to increase the acid concentration in the first acid polymer and to diffuse acid moieties into the exposed portion of the first threshold voltage adjusting layer which react with the first exposed threshold voltage adjusting layer to provide an acid reacted first threshold voltage adjusting layer within the second device region that laterally abuts a non-acid reacted first threshold voltage adjusting layer within the first device region;
    removing the baked first acid polymer using an aqueous solution or an organic solvent;
    removing the first patterned mask and the first acid reacted threshold voltage adjusting layer, wherein at least said first acid reacted threshold voltage adjusting layer is removed by a dry etching process selected from the group consisting of reactive ion etching, ion beam etching, plasma etching and laser ablation;
    forming a second threshold voltage adjusting layer atop the high k gate dielectric and the non-acid reacted first threshold voltage adjusting layer;
    forming a second patterned mask protecting a portion of the second threshold voltage adjusting layer within the second device region, while leaving another portion of the second threshold voltage adjusting layer within the first device region unprotected;
    forming a second acid polymer atop the second patterned mask and atop the exposed portion of the second threshold voltage adjusting layer, said second acid polymer comprises another polymerized compound or mixture of compounds comprising repeating structural units including at least one acid functional group attached thereto;
    baking the second acid polymer to increase the acid concentration in the second acid polymer and to diffuse acid moieties into the exposed portion of the second threshold voltage adjusting layer which react with the exposed second threshold voltage adjusting layer to provide a second acid reacted threshold voltage adjusting layer in the first device region abutting a non-acid reacted second threshold voltage adjusting layer in the second device region;
    removing the second baked acid polymer using an aqueous solution or an organic solvent;
    removing the second patterned mask and the second acid reacted threshold voltage adjusting layer from the first device region, wherein at least said second acid reacted threshold voltage adjusting layer is removed by a dry etching process selected from the group consisting of reactive ion etching, ion beam etching, plasma etching and laser ablation; and
    forming a conductive material atop remaining portions of the first threshold voltage adjusting layer and the second threshold voltage adjusting layer.

13. The method of claim 12 wherein said first threshold voltage adjusting layer is a pFET threshold voltage adjusting material or an nFET threshold voltage adjusting material, and the second threshold voltage adjusting layer is the other of the pFET threshold voltage adjusting material or the nFET threshold voltage adjusting material not employed as the first threshold voltage adjusting layer.

14. The method of claim 13 wherein the nFET threshold voltage adjusting material is selected from an oxide or nitride of at least one element from Group IIIB of the Periodic Table of Elements or an alkaline earth metal-containing material having a formula $MA_X$ wherein M is an alkaline earth metal and A is one of O, S and a halide and x is 1 or 2.

15. The method of claim 13 wherein said pFET threshold voltage adjusting material is selected from an oxide of aluminum, germanium, titanium or tantalum.

16. The method of claim 12 wherein said first and second acid polymers include a polymer comprising a sulfur-containing acidic moiety.

17. The method of claim 16 wherein said sulfur-containing acidic moiety is a sulfonic acid moiety.

18. The method of claim 17 wherein said sulfonic acid moiety is a fluorosulfonic acid.

19. The method of claim 12 wherein said first and second acid polymers include a salt of a strong acid.

20. The method of claim 19 wherein said salt of the strong acid is an ammonium salt.

* * * * *